(12) United States Patent
Fattal et al.

(10) Patent No.: US 7,805,041 B2
(45) Date of Patent: Sep. 28, 2010

(54) ELECTROMAGNETIC RADIATION AMPLIFICATION SYSTEMS BASED ON PHOTONIC GRATINGS

(75) Inventors: David Fattal, Mountain View, CA (US);
Mihail Sigalas, Santa Clara, CA (US);
Raymond G. Beausoleil, Redmond, WA (US); Charles Santori, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 99 days.

(21) Appl. No.: 11/726,104

(22) Filed: Mar. 21, 2007

(65) Prior Publication Data

US 2008/0232754 A1    Sep. 25, 2008

(51) Int. Cl.
*G02B 6/10*    (2006.01)
(52) U.S. Cl. ...................................................... 385/129
(58) Field of Classification Search ........................ None
See application file for complete search history.

(56) References Cited

U.S. PATENT DOCUMENTS

| | | | |
|---|---|---|---|
| 6,356,383 B1 | 3/2002 | Cornwell, Jr. et al. | |
| 6,678,087 B1 | 1/2004 | Masuda et al. | |
| 6,826,223 B1* | 11/2004 | Meyer et al. | 372/96 |
| 7,120,344 B2* | 10/2006 | Noda et al. | 385/129 |
| 7,158,711 B2* | 1/2007 | Tokushima | 385/131 |
| 7,236,138 B2* | 6/2007 | Wang | 343/754 |
| 7,308,163 B2* | 12/2007 | Bratkovski et al. | 385/12 |
| 7,346,251 B2* | 3/2008 | Bose et al. | 385/129 |
| 7,352,941 B2* | 4/2008 | Bratkovski et al. | 385/129 |
| 2003/0072519 A1* | 4/2003 | Bolanos | 385/16 |
| 2006/0066493 A1* | 3/2006 | Wang | 343/754 |
| 2007/0237479 A1* | 10/2007 | Seol et al. | 385/129 |

FOREIGN PATENT DOCUMENTS

JP    02-012980    1/1990

* cited by examiner

*Primary Examiner*—Sarah Song

(57) ABSTRACT

Various embodiments of the present invention are related to electromagnetic wave amplification systems employing photonic gratings. In one embodiment of the present invention, an electromagnetic radiation amplification system comprises a photonic grating and a pump source. The photonic grating is configured with a planar periodic lattice of holes in a slab. The pump source is coupled to the photonic grating and outputs an electronic stimulus that excites electronic energy states in the photonic grating so that a coherent beam of electromagnetic radiation incident upon the photonic grating stimulates emission of coherent electromagnetic radiation that amplifies the coherent beam of electromagnetic radiation.

20 Claims, 15 Drawing Sheets

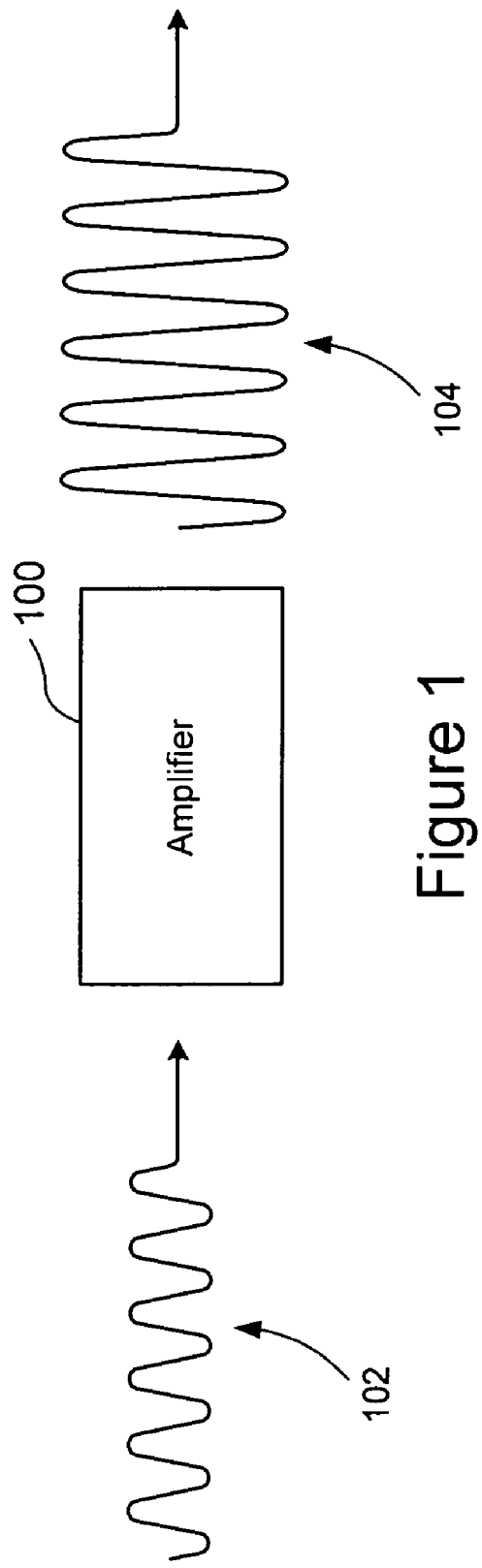

ELECTROMAGNETIC RADIATION AMPLIFICATION SYSTEMS BASED ON PHOTONIC GRATINGS

TECHNICAL FIELD

Various embodiments of the present invention are directed to amplifiers, and, in particular, to electromagnetic radiation amplifiers that employ photonic gratings.

BACKGROUND

Electromagnetic radiation traveling through any transmission medium suffers from attenuation. In fact, the farther electromagnetic radiation travels through a transmission medium the more the radiation losses strength. Computational and communication systems that process and transmit information encoded in electromagnetic radiation may avoid this problem by amplifying or increasing the strength of the electromagnetic radiation at points along the transmission path. An electromagnetic radiation amplifier is a device that can be placed at points along the transmission path to increases the amplitude of incident electromagnetic radiation. FIG. 1 illustrates operation of an electromagnetic radiation amplifier 100. Ideally, the amplifier 100 receives an incident coherent beam of electromagnetic radiation represented by a first plane wave 102 and emits a higher intensity coherent beam of electromagnetic radiation, which is represented by a second plane wave 104 with a larger amplitude than the incident coherent beam of electromagnetic radiation 102. The amplified coherent beam of electromagnetic radiation propagates in substantially the same direction and with substantially the same wavelength λ and phase as the incident coherent beam of electromagnetic radiation 102.

As part of the amplification process, an electromagnetic radiation amplifier includes a gain medium that is pumped or energized into a higher energy electronic state. Pumping a gain medium is typically accomplished using either electromagnetic radiation emitted from an external laser source or an electrical signal. After the gain medium is pumped, the incident coherent electromagnetic radiation stimulates emission of electromagnetic radiation within the gain medium. This stimulated electromagnetic radiation has substantially the same direction, wavelength, and a fixed phase relationship with the incident electromagnetic radiation and constructively interferes with the incident electromagnetic radiation producing an amplified coherent beam of electromagnetic radiation.

Doped fiber amplifiers are a commonly used amplifier. The gain medium of a typical doped fiber amplifier is comprised of a fiber optic core that has been doped with atoms and is surrounded by a cladding layer. Pump electromagnetic radiation from an external laser excites the atoms into higher energy electronic states. An incident beam of electromagnetic radiation to be amplified is transmitted through the core and stimulates emission of electromagnetic radiation with substantially the same phase, wavelength, and direction from the excited atoms, which, in turn, yields via constructive interference an amplified coherent beam of electromagnetic radiation. The core guides the pump electromagnetic radiation and the amplified coherent beam of electromagnetic radiation. Semiconductor amplifiers are another type of commonly used electromagnetic radiation amplifier. The gain medium of a semiconductor amplifier typically comprises a pn-junction layer located between a positively doped semiconductor region and a negatively doped semiconductor region. An incident coherent beam of electromagnetic radiation to be amplified is directed into the pn-junction layer and is amplified when the incident electromagnetic radiation stimulates emission of electromagnetic radiation produced by recombining electron-holes pairs within the pn-junction layer. This electromagnetic radiation also has substantially the same phase, wavelength, and direction as the incident electromagnetic radiation and also yields via constructive interference an amplified coherent beam of electromagnetic radiation Doped optical fiber amplifiers and semiconductor amplifiers can be fabricated to amplify signals over a broad range of frequencies, however these amplifiers typically cannot be designed to amplify electromagnetic radiation selectively in a narrow range of frequencies without creating a disturbance at the other frequencies. In addition, a doped fiber amplifier is typically too large to be coupled with micro scale and nanoscale optical devices. Although semiconductor amplifiers can be fabricated on the micro scale, the structural difference between semiconductor amplifiers and optical fibers makes it difficult to couple an optical fiber with the pn-junction layer of a semiconductor amplifier. Physicists and engineers have recognized a need for electromagnetic radiation amplifiers that can amplify a coherent beam of electromagnetic radiation over selected narrow frequency ranges and are small enough to be implemented in a variety of micro scale and nanoscale optical devices.

SUMMARY

Various embodiments of the present invention are related to electromagnetic wave amplification systems employing photonic gratings. In one embodiment of the present invention, an electromagnetic radiation amplification system comprises a photonic grating and a pump source. The photonic grating is configured with a planar periodic lattice of holes in a slab that couples with an incident coherent beam of electromagnetic radiation. The pump source outputs an electronic stimulus that excites electronic energy states in the photonic grating so that the incident coherent beam of electromagnetic radiation stimulates emission of coherent electromagnetic radiation that amplifies the incident coherent beam of electromagnetic radiation.

BRIEF DESCRIPTION OF DRAWINGS

FIG. 1 illustrates operation of an electromagnetic radiation amplifier.

DETAILED DESCRIPTION

Various embodiments of the present invention are directed to electromagnetic radiation amplification systems employing dielectric photonic gratings incorporating some gain material. Resonances in the photonic gratings can be used to amplify a coherent beam of electromagnetic radiation over a narrow frequency range. Electromagnetic radiation gain can be controlled by adjusting the size of features and dielectric constants of the photonic grating. In addition, the photonic gratings are substantially transparent to electromagnetic radiation with frequencies outside the narrow frequency range.

The term "photonic" as used to describe various embodiments of the present invention refers to devices that can be used to transmit either classical electromagnetic waves or quantized electromagnetic waves with wavelengths that span the electromagnetic spectrum. In other words, the term "photonic" as used to describe embodiments of the present invention is not limited to devices for transmitting quanta of electromagnetic radiation called "photons." In order to assist readers in understanding descriptions of various embodiments of the present invention, an overview of photonic gratings is provided in a first subsection. Various system and method embodiments of the present invention are described in a second subsection.

Photonic Gratings

Figure 2A:
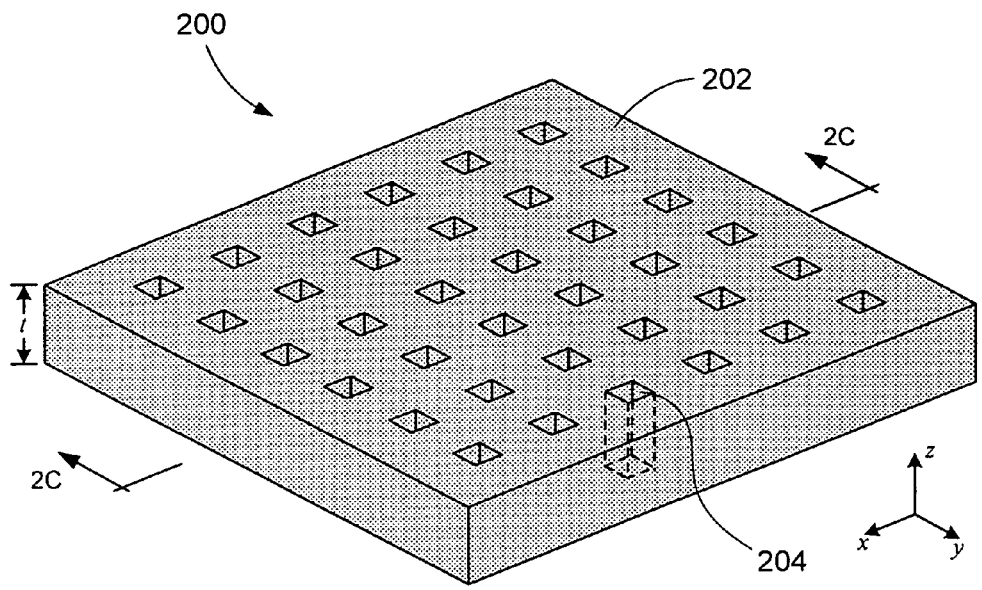
FIG. 2A illustrates an isometric view of a first two-dimensional photonic grating that represents an embodiment of the present invention.
Figure 2B:
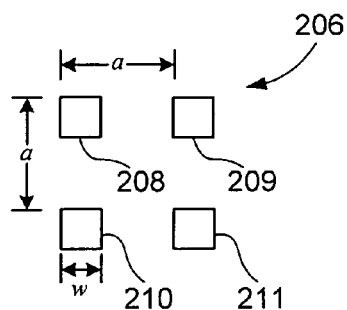
FIG. 2B illustrates a unit cell of the photonic grating shown in FIG. 2A.
Figure 2C:
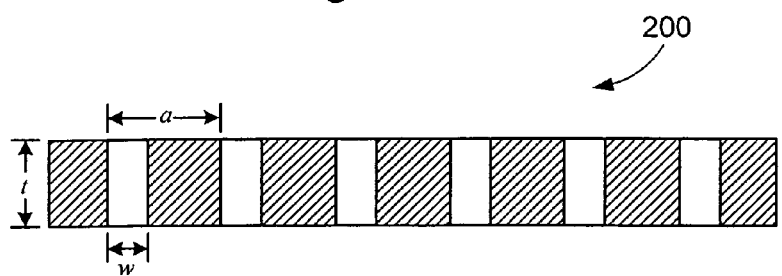
FIG. 2C illustrates a cross-sectional view of the photonic grating shown in FIG. 2A, taken along the line 2C-2C.

FIG. 2A illustrates an isometric view of a two-dimensional photonic grating 200 that represents an embodiment of the present invention. The photonic grating 200 comprise of a slab 202 including a lattice of holes that lie in the xy-plane of the photonic grating 200. Each hole in the lattice spans the thickness or height t of the slab 200. For example, a hole 204 spans the height of the slab 202. As shown in FIG. 2A, the holes are arranged in a substantially square lattice configuration. FIG. 2B illustrates a unit cell 206 of the photonic grating 200 that represents an embodiment of the present invention. The unit cell 206 comprises four substantially square shaped holes 208-211 each with a width w that are arranged in a substantially square configuration with a lattice constant a. FIG. 2C illustrates a cross-sectional view of the photonic grating 200 that represents an embodiment of the present invention.

Figure 3A:
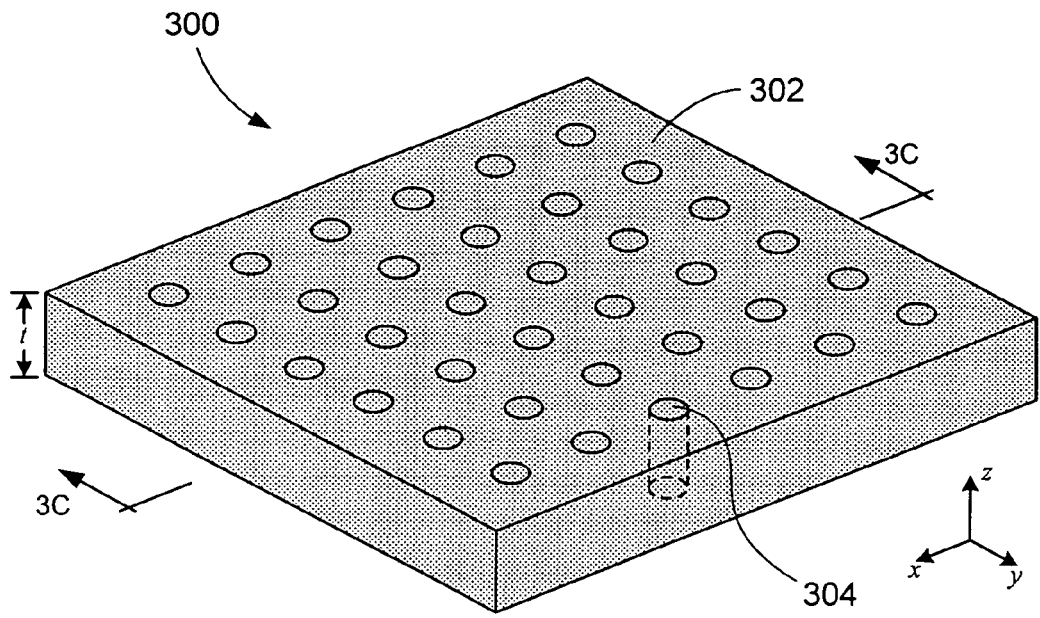
FIG. 3A illustrates an isometric view of a second two-dimensional photonic grating that represents an embodiment of the present invention.
Figure 3B:
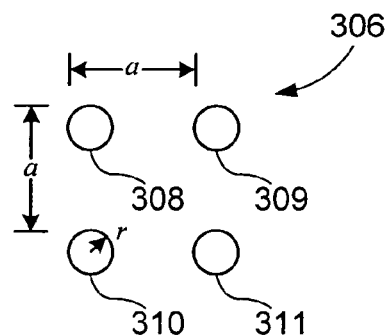
FIG. 3B illustrates a unit cell of the photonic grating shown in FIG. 3A.
Figure 3C:
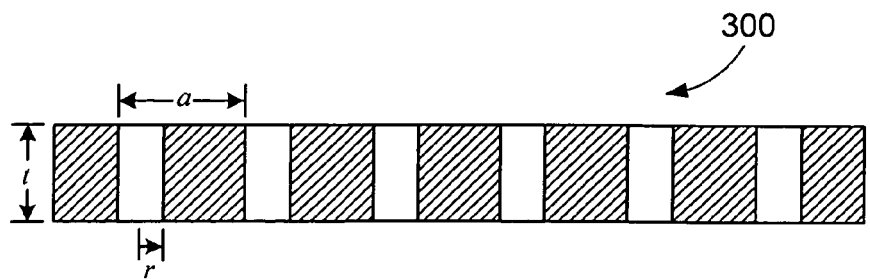
FIG. 3C illustrates a cross-sectional view of the photonic grating shown in FIG. 3A, taken along the line 3C-3C.

In other embodiments of the present invention, the lattice of holes can have different shapes. FIG. 3A illustrates an isometric view of a second two-dimensional photonic grating 300 that represents an embodiment of the present invention. The photonic grating 300 comprises a slab 302 with a lattice of circular holes that lie in the xy-plane of the slab 302. Each hole in the lattice spans the thickness or height t of the photonic grating 300, such as hole 304. FIG. 3B illustrates a unit cell 306 of the photonic grating 300 that represents an embodiment of the present invention. The unit cell 306 is comprised of four substantially circular holes 308-311 each with substantially the same radius r and arranged in a substantially square configuration with a lattice constant a. FIG. 3C illustrates a cross-sectional view of the photonic grating 300 that represents an embodiment of the present invention.

Figure 4A:
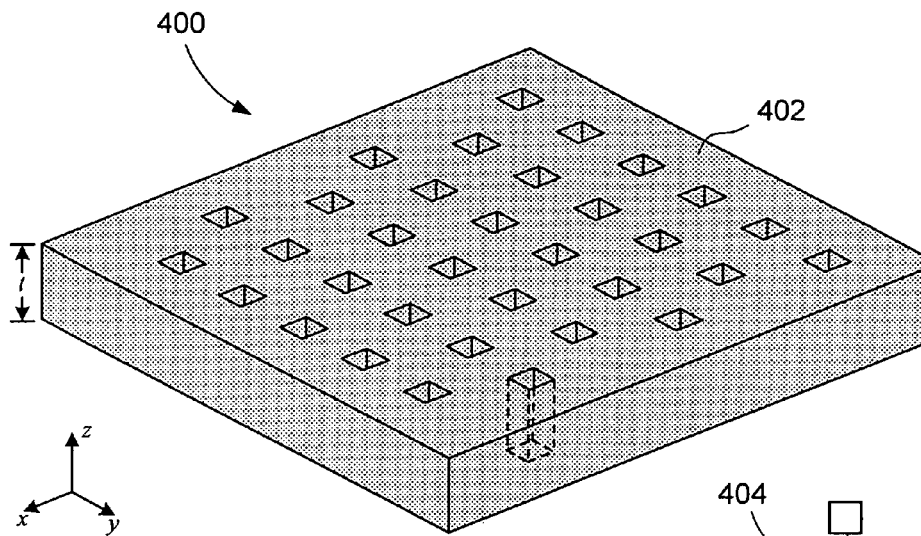
FIG. 4A illustrates an isometric view of a third two-dimensional photonic grating that represents an embodiment of the present invention.
Figure 4B:
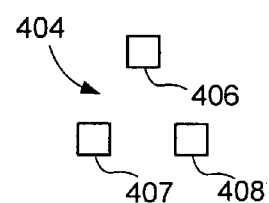
FIG. 4B illustrates a unit cell of the photonic grating shown in FIG. 4A.
Figure 5A:
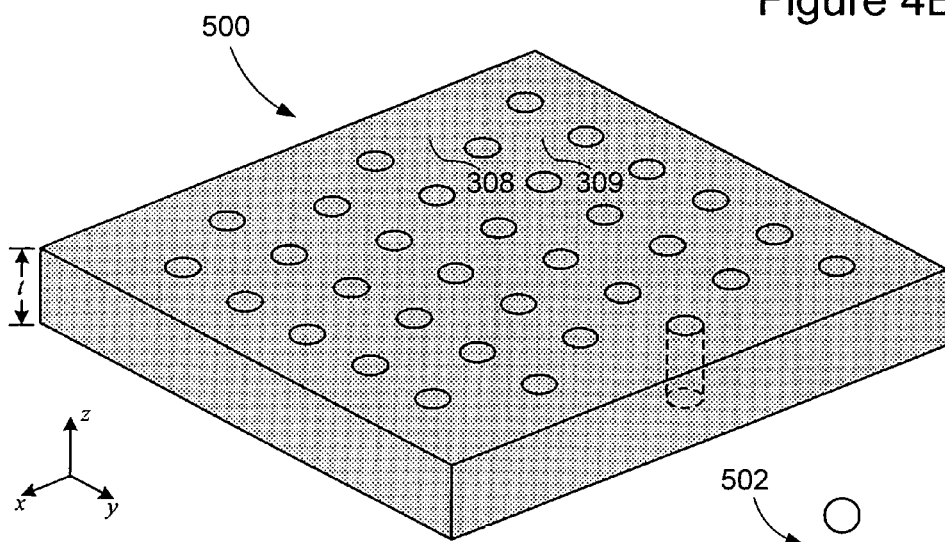
FIG. 5A illustrates an isometric view of a fourth two-dimensional photonic grating that represents an embodiment of the present invention.
Figure 5B:
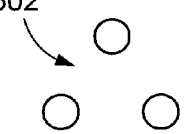
FIG. 5B illustrates a unit cell of the photonic grating shown in FIG. 5A.

In other embodiments of the present invention, the lattice of holes can have different unit cell configurations. FIG. 4A illustrates an isometric view of a third two-dimensional photonic grating 400 that represents an embodiment of the present invention. The photonic grating 400 comprises a slab 402 with substantially square holes arranged in a substantially triangle unit cell configuration. FIG. 4B illustrates a unit cell 404 of the photonic grating 400 comprising three substantially square holes 406-408 arranged in a substantially triangular configuration that represents an embodiment of the present invention. FIG. 5A illustrates an isometric view of a fourth two-dimensional photonic grating 500 that represents an embodiment of the present invention. FIG. 5B illustrates a unit cell 502 of the photonic grating 500 that is substantially identical to the photonic grating 400 except with substantially circular holes comprising the lattice of holes.

In various embodiments of the present invention, a photonic grating slab can be comprised of a single dielectric, a semiconductor, or a semiconductor compound. The type of material chosen for a photonic grating slab may depend on the dimensions and configuration of the photonic grating needed, on the mode parameters associated with an incident beam of electromagnetic radiation, such as the propagating direction $\vec{k}$ and the polarization, or on the frequency or wavelength range of the incident beam of electromagnetic radiation. For example, a photonic grating slab can be comprised of $SiO_2$, SiN, or a semiconductor, such as Si or Ge. A photonic grating slab can also be comprised of binary, ternary, or quaternary II-VI or III-V semiconductor compounds. For example, a photonic grating slab can be comprised of either ZnTe or CdSe, both II-VI semiconductor compounds, or either GaAs or InP, both III-V semiconductor compounds. A photonic grating slab can be comprised of two or more layers, wherein each layer may be comprised of a different material. For example, a photonic grating slab may be comprised of a single layer of GaAs sandwiched between two layers of AlGaAs. The photonic grating slabs can be formed using molecular beam expitaxy or chemical vapor deposition. A photonic grating can also be comprised of an organic material doped with a phosphorescent dye. For example, the organic material can be tris-(8-hydroxyquinoline) aluminum doped with Pt(II) octaethylporphine.

The lattice of holes can be formed in a photonic grating using one of numerous well-known lithographic and etching techniques. For example, a lattice of holes can be formed in a slab using reactive-ion etching, focused ion-beam etching, chemically assisted ion-beam etching, electron beam lithography, photolithography, and nanoimprint lithography, all of which are well-known in the art and may be selected based on the size of holes needed and on the slab material. The holes can be air holes or comprised of a dielectric, a semiconductor, or a semiconductor compound material having a dielectric constant different from that of the photonic grating slab. The holes can be filled with a material using physical vapor deposition or chemical vapor deposition techniques.

Note that electromagnetic waves and coherent beams of electromagnetic radiation are represented in subsequent Figures by the electric field component alone. This is because, although a single electromagnetic wave comprises both an electric field component E and an orthogonal magnetic field component B, the amplitude of the magnetic field component is smaller than the amplitude of the electric field component by a factor of $1/c$, where c represents the speed of light in free space ($c=3.0\times10^8$ m/sec), and the electric field component accounts for most of the electromagnetic wave interactions with matter.

Figure 6:
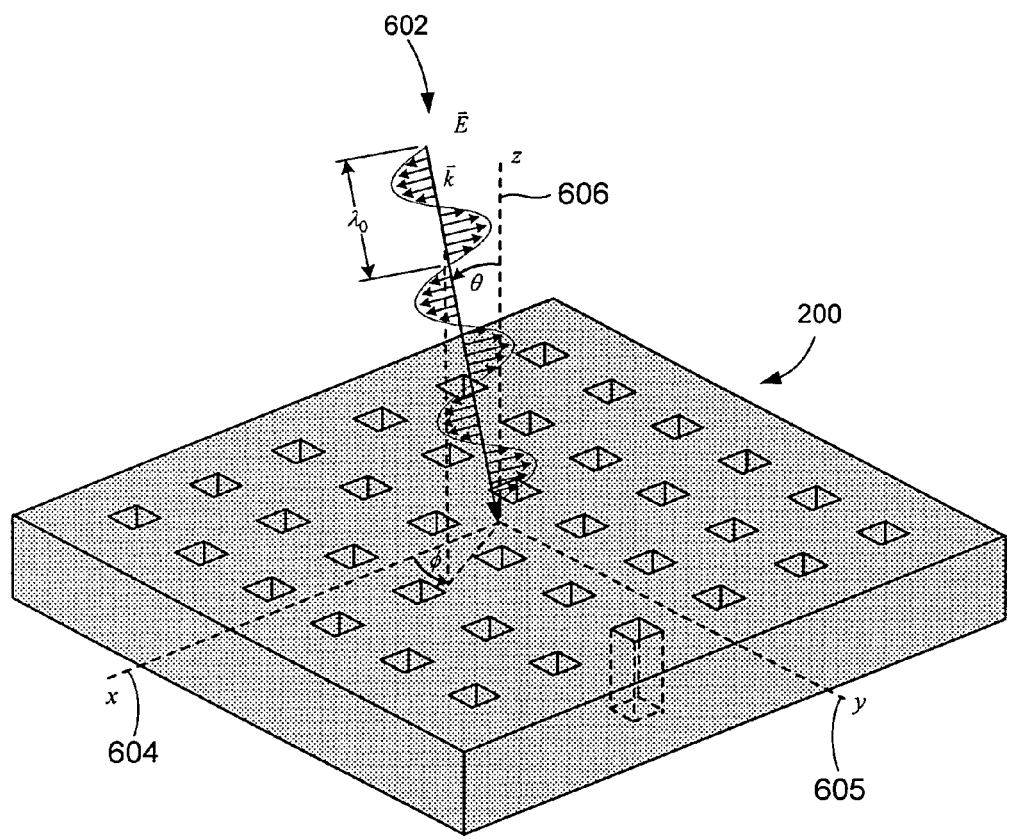
FIG. 6 illustrates the photonic grating shown in FIG. 2A and an electric field component of an incident electromagnetic wave.

FIG. 6 illustrates the photonic grating 200 and the electric field component of an incident electromagnetic wave 602. In FIG. 6, axes 604-606 represent Cartesian coordinate axes $\hat{x}$, $\hat{y}$, and $\hat{z}$, respectively. The electromagnetic wave has an associated wave vector:

$$\vec{k} = k_x\hat{x} + k_y\hat{y} + k_z\hat{z}$$
$$= k(\sin\theta\cos\phi\hat{x} + \sin\theta\sin\phi\hat{y} + \cos\theta\hat{z})$$

where k is the wave number of the incident electromagnetic wave 602, and the parameters $\theta$ and $\phi$ are the incident angles of the electromagnetic wave. Incident electromagnetic waves are typically transmitted through the photonic grating 200. However, for each incident electromagnetic wave of a particular polarization and wavelength $\lambda$, there is an associated pair of incident angles $\theta$ and $\phi$ for which the electromagnetic wave is not transmitted through the photonic grating 200. Instead, these electromagnetic waves couple with the photonic grating lattice structure and have a frequency-resonant mode within the xy-plane of photonic grating. For example, consider the electromagnetic wave 602 with a particular polarization and wavelength $\lambda_0$ incident upon the photonic grating 200. For a large number of incident angles $\theta$ and $\phi$, the photonic grating 200 is transparent to the incident electromagnetic wave 602. However, there exists a pair of incident angles $\theta_0$ and $\phi_0$ for which the incident electromagnetic wave has a resonance frequency $f_0$ within the xy-plane of the photonic grating 200. In other words, the photonic grating 200 serves as a Bragg reflector for the electromagnetic wave, and the photonic grating 200 is not transparent to this electromagnetic wave with wave vector angles $\theta_0$ and $\phi_0$. This resonance phenomenon is the result of the coupling between the incident electromagnetic wave 602 and the electromagnetic radiation modes that can be supported by the photonic grating.

The resonance frequency, or resonance, $f_0$ is the frequency at which the electromagnetic wave vibrates with the largest amplitude $A_{max}$ or vibrational energy $E_{max}$ ($\approx A_{max}^2$). The resonance frequency $f_0$ is determined by the dielectric constant $\epsilon$, the lattice constant a, the hole width w, and the thickness t. The quality ("Q") factor is one way to quantitatively assess the sharpness of the resonance of a photonic grating. The following is a brief, but general, description of the Q factor and how the Q factor can be used to qualitatively characterize energy loss for vibrating systems. The Q factor compares the frequency at which a system oscillates to the rate at which the system losses energy. A relatively large Q factor indicates a low rate of energy dissipation relative to the resonance frequency of the system. In general, the Q factor can be represented by:

$$Q \approx \frac{f_0}{\Delta f}$$

where $\Delta f$ is the range of frequencies for which the vibrational energy of the physical system is at least one-half of the maximum vibrational energy $E_{max}$ at $f_0$.

Figure 7:
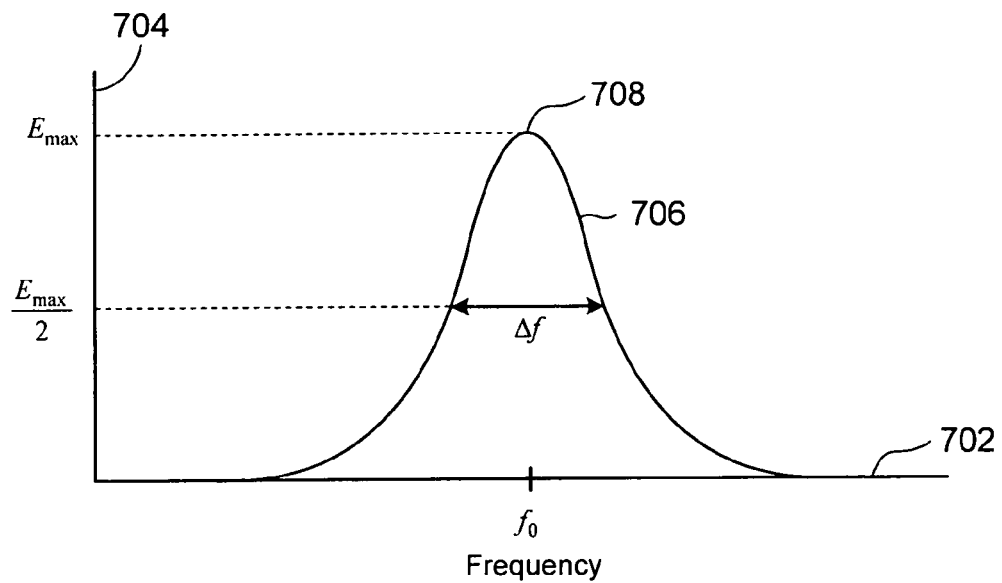
FIG. 7 shows a plot of a steady-state vibrational energy distribution versus vibrational frequency.

FIG. 7 shows a plot of a steady-state vibrational energy distribution versus vibrational frequency. Horizontal line 702 is a frequency axis, vertical line 704 is a vibrational energy axis, and curve 706 is a normal distribution that represents the vibrational energy of a system as a function of vibrational frequencies and is centered about the resonance frequency $f_0$. The maximum 708 of the curve 706 is the maximum vibrational energy $E_{max}$ or amplitude $A_{max}$. The magnitude of the slope of the curve 706 increases the further away the vibrational frequency of the system is from the resonance frequency $f_0$. In other words, the further away the system vibrational frequency is from the resonance frequency $f_0$, the lower the vibrational energy available to the system.

Returning now to Q factors associated with photonic gratings. The photonic grating Q factor associated with the resonance of an electromagnetic wave resonating in the xy-plane of a photonic grating increases when the slab thickness decreases, when the hole size decreases, or when the index contrast ($\epsilon_s - \epsilon_h$) between the dielectric constant of the slab $\epsilon_s$ and the dielectric constant $\epsilon_h$ of the holes decreases. An electromagnetic wave resonating in a photonic grating with a large Q factor resonates with a larger amplitude or more vibrational energy than an electromagnetic wave with an associated small Q factor. In addition, a small Q factor indicates that the resonance of an electromagnetic wave resonating in a photonic grating is short lived, while a large Q factor indicates that the resonance of an electromagnetic wave remains trapped in the photonic grating for a longer period of time.

Figure 8:
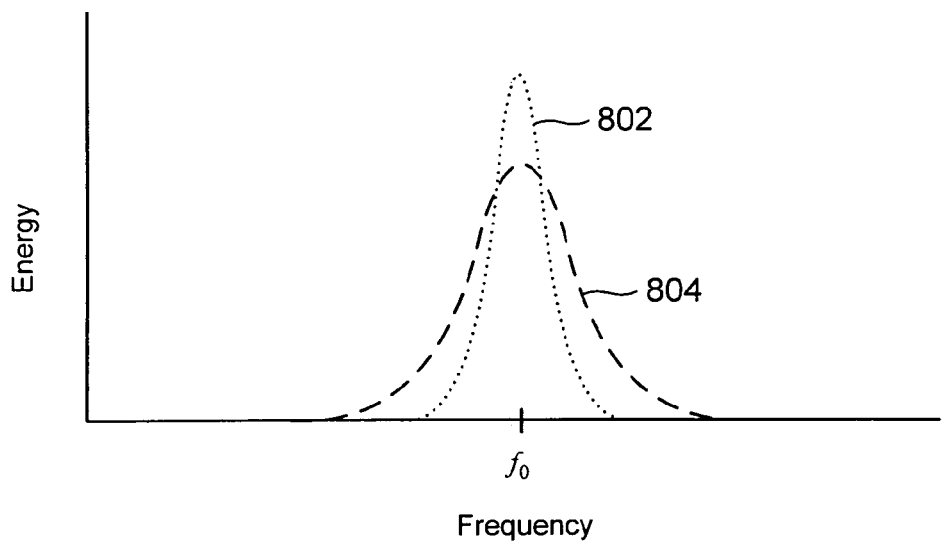
FIG. 8 shows a plot of two steady-state vibrational energy distributions versus vibrational frequency for two hypothetical photonic gratings.

FIG. 8 shows two steady-state vibrational energy curves versus vibrational frequency associated with two hypothetical photonic gratings. The first photonic grating and the second photonic grating have identical dielectric constants $\epsilon_s$ and $\epsilon_h$, lattice constant a, and hole width w. However, the thickness of the first photonic grating is smaller than the thickness of the second photonic grating. According to the photonic grating Q factor expression above, the Q factor associated with the first photonic grating is larger than the Q factor associated with the second photonic grating. In FIG. 8, curve 802 corresponds to the vibrational energy distribution of the first photonic grating, and curve 804 corresponds to the vibrational energy distribution of the second photonic grating. The curve 802 is narrower than the curve 804, which indicates that an electromagnetic wave with a resonance frequency $f_0$ resonates and remains trapped in the first photonic grating with a larger vibrational energy and for a longer period of time than an electromagnetic wave with the resonance frequency $f_0$ resonating in the second photonic grating.

EMBODIMENTS OF THE PRESENT INVENTION

Figure 9:
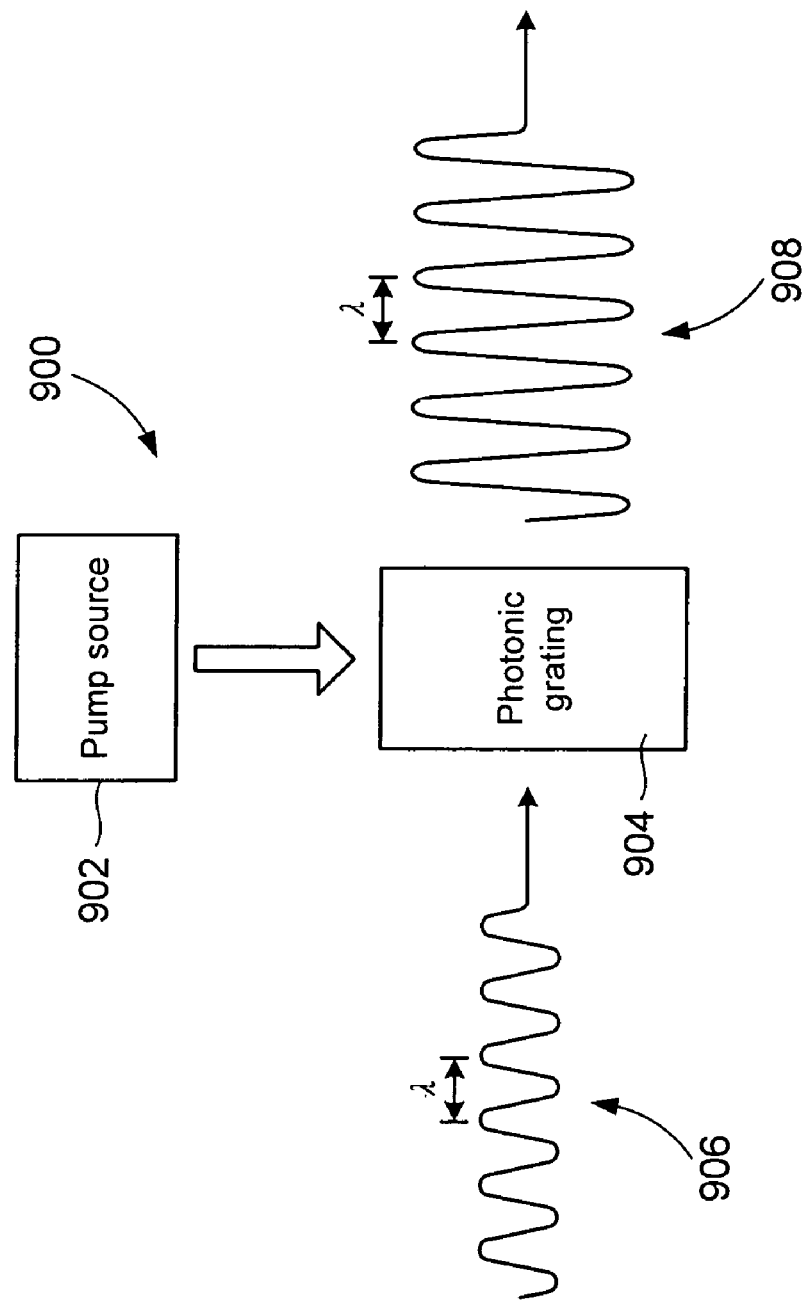
FIG. 9 illustrates a schematic representation of an electromagnetic radiation amplifier that represents an embodiment of the present invention.

FIG. 9 illustrates a schematic representation of an electromagnetic radiation amplifier 900 that represents an embodiment of the present invention. The amplifier 900 comprises a pump source 902 and a photonic grating 904. The photonic grating 902 is coupled to the pump source 902 and receives an electronic stimulus from the pump source 902 and an incident coherent beam of electromagnetic radiation represented by an electric field wave component 906. The intensity of the incident coherent electromagnetic radiation 906 can be represented by:

$$I_i = \frac{1}{2}\varepsilon_0 c |E(f)|^2$$

where
 $\varepsilon_0$ represents the permittivity of free space;
 c represents the speed of light in free space;
 E(f) represents the amplitude of electric field of the incident electromagnetic radiation; and
 f represents the frequency of the electromagnetic radiation.

The amplifier 900 is a frequency selective coherent amplifier because the lattice constant a, dielectric constant $\varepsilon$ of the slab material, hole width w, and thickness t of the photonic grating 904 can be pre-selected so that the incident coherent beam of electromagnetic radiation 906 couples with the electromagnetic radiation modes supported by the photonic grating 904. The electronic stimulus couples with electromagnetic radiation emitters in the photonic grating 904 in order to produce an amplified coherent beam of electromagnetic radiation represented by electric field component 908. In other embodiments of the present invention, the electromagnetic radiation emitters can be dopants, quantum wells, quantum dots or another suitable electromagnetic radiation emitting material The amplified coherent beam of electromagnetic radiation 908 can be represented by:

$$I_e = \frac{1}{2}\varepsilon_0 c |g(f)|^2 |E(f)|^2$$

where g(f) is a frequency dependent complex-valued transmission factor that represents increased amplitude of the coherent electromagnetic radiation emitted from the photonic grating; and |g(f)| is the transmission, which is largest at the resonance and rapidly becomes negligible for frequencies further away from the resonance mode of the photonic grating. The amplified coherent beam of electromagnetic radiation 908 emitted from the photonic grating 904 has a larger amplitude and has substantially the same phase, polarization, frequency $f_0$, and direction as the incident coherent beam of electromagnetic radiation 906.

In certain embodiments of the present invention, the photonic grating 904 may include one or more different types of dopant atoms and/or molecules that serve as the electromagnetic radiation emitters. For example, Erbium, Ytterbium, Thulium, Neodymium, and Chromium are just a few of the atoms that may be suitable dopants for the photonic grating 904. The dopant is selected for the photonic grating 904 based on the frequency of the incident coherent beam of electromagnetic radiation. For example, when the frequency of an incident coherent beam of electromagnetic radiation to be amplified is approximately 1550 nm, Erbium atoms may be selected as the photonic grating dopant because when an appropriate electronic stimulus is applied to Erbium atoms, these atoms emit coherent electromagnetic radiation with frequencies ranging from about 1530 to about 1625 nm.

Figure 10:
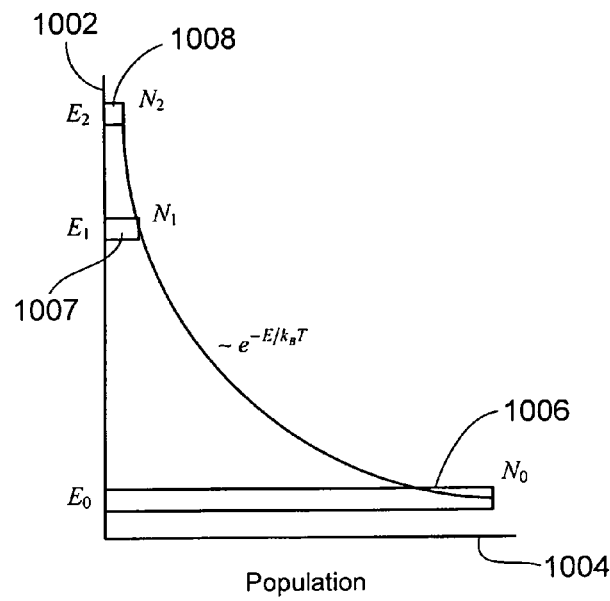
FIG. 10 shows an energy-level population distribution for a three-level dopant.

Amplification can be achieved by exciting a substantial percentage of the dopants into excited electronic energy states, leaving the lowest electronic energy state of the dopants substantially empty. This process is called "population inversion" and is now described with reference to FIGS. 10-12 for three-level and four-level dopants. FIG. 10 shows an energy-level population distribution for a photonic grating doped with a three-level dopant prior to application of an electronic stimulus. Vertical axis 1002 represents electronic energy and horizontal axis 1004 represents the population of dopants. Horizontal bar 1006 represents the number of dopants $N_0$ in the lowest electronic energy, or ground, state $E_0$, horizontal bar 1007 represents the number of dopants $N_1$ in the first excited electronic energy state $E_1$, and horizontal bar 1008 represents the number of dopants $N_2$ in the second excited electronic energy state $E_2$. As shown in FIG. 10, prior to application of the electronic stimulus from the pump source 902, the relative electronic energy level populations of any two electronic energy levels $E_i$ and $E_j$ obey Boltzmann's principle given by:

$$\frac{N_i}{N_j} = e^{-(E_i - E_j)/k_B T} = e^{-hf_{ij}/k_B T}$$

where $k_B$ is Boltzmann's constant ($8.617 \times 10^{-5}$ eV/K), and T is the temperature. In other words, prior to application of the electric stimulus, a much larger number of the dopants are in the ground electronic state than the number of the dopants in the excited electronic energy states:

$$N_1 + N_2 << N_0$$

Figure 11:
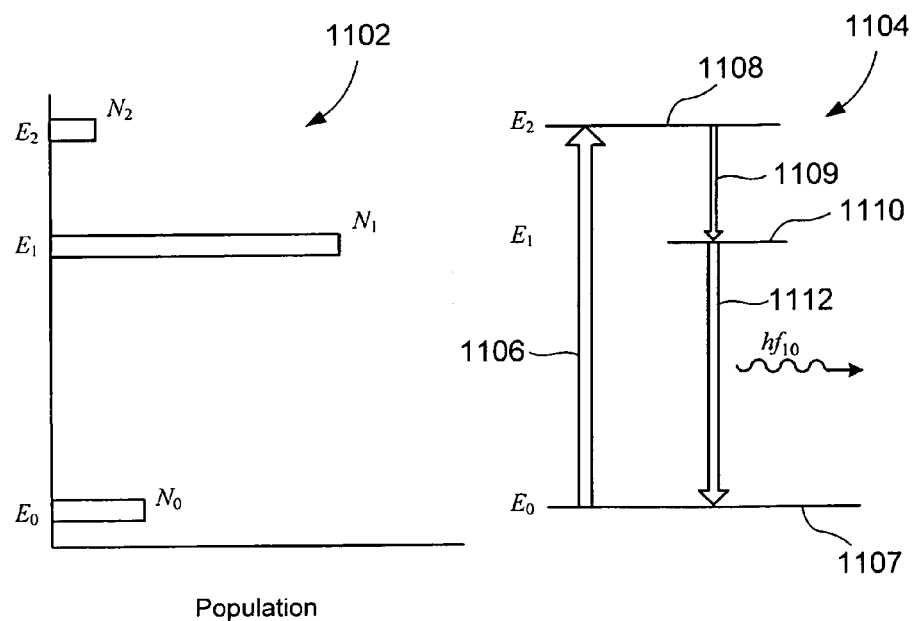
FIG. 11 shows an energy-level population distribution and a corresponding energy-level diagram for a three-level dopant after application of an electronic stimulus.

FIG. 11 shows an energy-level population distribution 1102 and a corresponding energy-level diagram 1104 for a single photonic grating dopant described with reference to FIG. 10 after the application of the electronic stimulus. As shown in the energy-level diagram 1104, the three-level dopant absorbs the electronic stimulus, which causes the dopant to make an electronic energy transition 1106 from the ground electronic energy state 1107 to the second electronic energy state 1108. The dopant remains in the second electronic energy state 1108 for a very short period of time (nanoseconds) before spontaneously decaying 1109 to a relatively longer lived (milliseconds) first electronic energy state 1110. The dopant typically decays from the second electronic energy state 1108 to the first electronic energy state 1110 via a nonradiative relaxation process, such as emission of acoustic waves. The longer lived first electronic energy state 1110 is called a "metastable state." The energy-level population distribution 1102 shows that as long as the electronic stimulus is applied and because the dopants can remain in the long lived metastable state 1110, the number of dopants in the metastable state 1110 $N_1$ is much larger than the number of dopants in the ground state 1106 $N_0$ ($N_0 \ll N_1$), which is called "population inversion."

A number of the dopants transition 1112 from the metastable state 1110 to the ground state 1107 via a nonradiative relaxation process, but a larger number of the dopants transition 1112 via radiative emission processes. Spontaneous emission and stimulated emission are two of the radiative emission processes. A spontaneous emission occurs when the dopant spontaneously transitions from the metastable state 1110 to the ground state 1107. A stimulated emission occurs as a result of the photons comprising the incident coherent beam of electromagnetic radiation stimulating individual dopants to transition from the metastable state 1110 to the ground state 1107 while emitting photons that are nearly identical copies of those in the incident beam. In both radiative emission processes, the energy of the electromagnetic radiation emitted by a single dopant transitioning from the metastable state 1110 to the ground state 1107 is:

$$E_1 - E_0 = hf_{10}$$

where $f_{10}$ is the frequency of the emitted electromagnetic radiation. In stimulated emission, dopants are selected so that the frequency $f_{10}$ of the emitted electromagnetic radiation substantially matches the frequency of the incident coherent beam of electromagnetic radiation. As long as the electronic stimulus is applied to the photonic grating 904, electromagnetic radiation with the frequency $f_{10}$ emitted within the photonic grating continues to stimulate the emission of more electromagnetic radiation with substantially the same frequency $f_{10}$.

Figure 12:
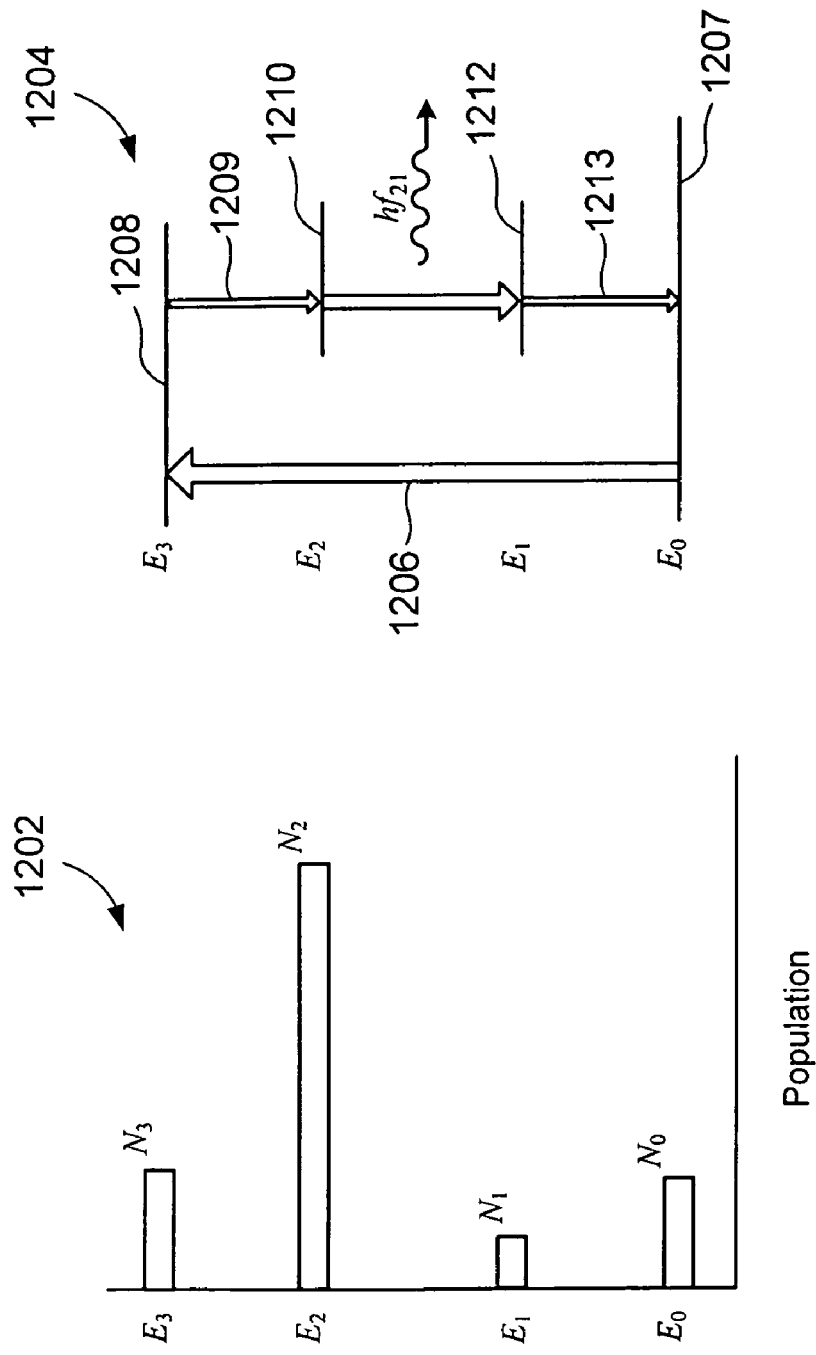
FIG. 12 shows an energy-level population distribution and a corresponding energy-level diagram for a four-level dopant after application of an electronic stimulus.

FIG. 12 shows an energy-level population distribution 1202 and a corresponding energy-level diagram 1204 for a single four-level dopant after the application of the electronic stimulus. As shown in the energy-level diagram 1204, the electronic stimulus causes the dopant to make an electronic energy transition 1206 from the ground state 1207 to a third electronic energy state 1208. Like the three-level dopant, the four level dopant remains in the third electronic energy state 1208 for a very short period of time before spontaneously decaying 1209 to a metastable state 1210 via a nonradiative relaxation process. In the case of the four-level dopant, the first excited state 1212 must decay rapidly by nonradiative or radiative means 1213 to the ground state 1207 to prevent a population bottleneck from developing. Then the energy-level population distribution 1202 shows that as long as the electronic stimulus is applied and because the dopants can remain in the long lived metastable state 1210, the number of dopants in the metastable state 1210 $N_2$ is much larger than the number of dopants in the first excited state 1212 $N_1$. A certain number of the dopants transition from the metastable state 1210 to the first excited state 1212 via spontaneous emission, but a larger number of the dopants makes the same transition via stimulation set off by the incident coherent beam of electromagnetic radiation. The energy of the electromagnetic radiation emitted by the dopant is:

$$E_2 - E_1 = hf_{21}$$

where $f_{21}$ is the frequency of the emitted electromagnetic radiation. The dopants are selected so that the frequency $f_{21}$ matches the frequency of the incident electromagnetic radiation. The dopant then rapidly decays 1213 to the ground state 1207 via another nonradiative relaxation process. As long as the electronic stimulus is applied to the photonic grating 904, electromagnetic radiation emitted with the frequency $f_{21}$ can continue to stimulate the emission of more electromagnetic radiation with the same frequency $f_{21}$.

Figure 13:
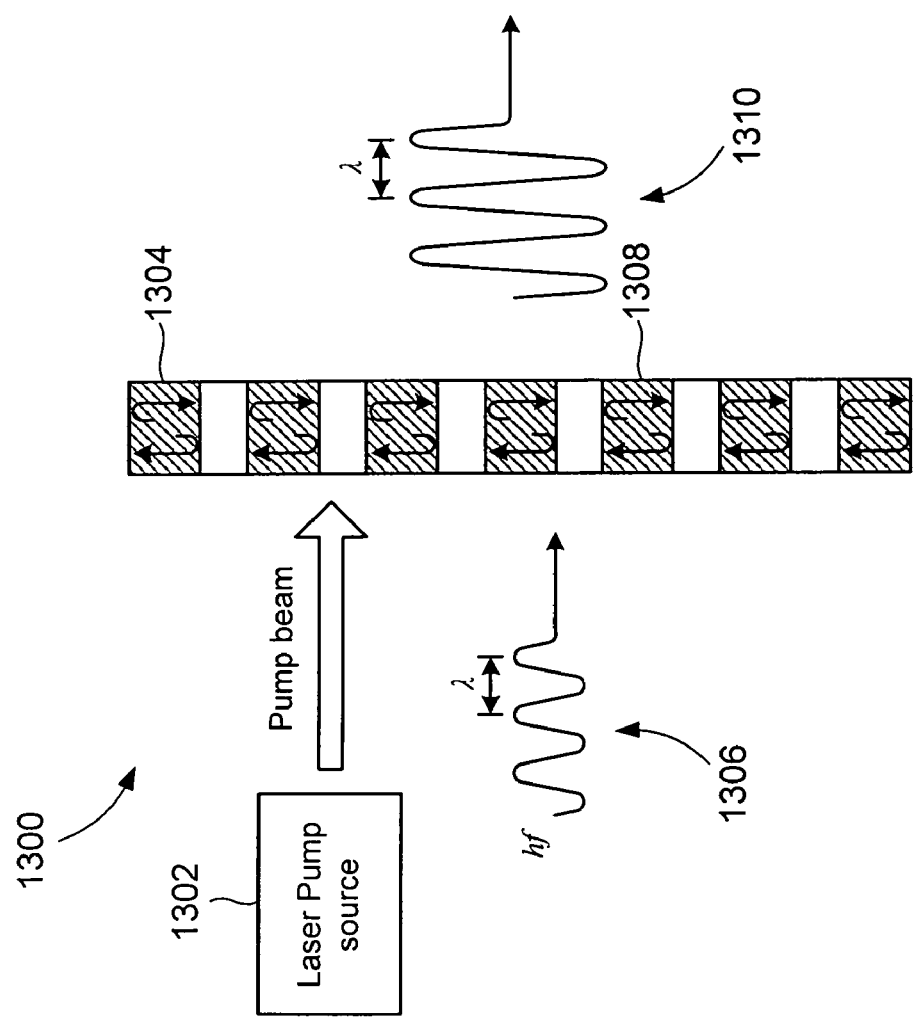
FIG. 13 illustrates a first electromagnetic radiation amplifier that represents an embodiment of the present invention.

In one embodiment of the present invention, the pump source 902 can be an optical pump source, such as a laser, LED, or flash lamp. FIG. 13 illustrates an electromagnetic radiation amplifier 1300 that represents an embodiment of the present invention. The amplifier 1300 comprises a laser pump source 1302 and a photonic grating 1304. An incident coherent beam of electromagnetic radiation 1306 to be amplified is incident upon the photonic grating 1304 with a selected polarization and wave vector $\vec{k}$. The lattice constant a, dielectric constant $\epsilon$ of the slab material, hole width w, and thickness t of the photonic grating 1304 are pre-selected so that the incident coherent beam of electromagnetic radiation 1306 couples with resonance modes supported by the photonic grating 1304, as described above with reference to FIGS. 6-8. The slab of the photonic grating 1304 is also doped with a dopant that generates gain in the photonic grating by emitting electromagnetic radiation at substantially the same frequency of the coherent electromagnetic radiation 1306. The dopant can be a three-level or a four level-dopant described above with reference to FIGS. 10-12. The laser pump source 1302 emits electromagnetic radiation at a selected frequency and with energy sufficient to electronically stimulate the dopants of the photonic grating 1304 so that stimulated emission of the dopant can be initiated by the coherent electromagnetic radiation 1306 resonating within the photonic grating 1304. Directional arrows, such as directional arrow 1308, represent the circulation of coherent electromagnetic radiation building up within the photonic grating 1304. After coherent electromagnetic radiation builds within the photonic grating, a coherent beam of electromagnetic radiation 1310 is emitted from the opposing surface of the photonic grating 1304. The emitted coherent beam of electromagnetic radiation 1310 has a larger amplitude and has substantially the same phase, polarization, frequency, and direction as the incident coherent beam of electromagnetic radiation 1306.

Figure 14A:
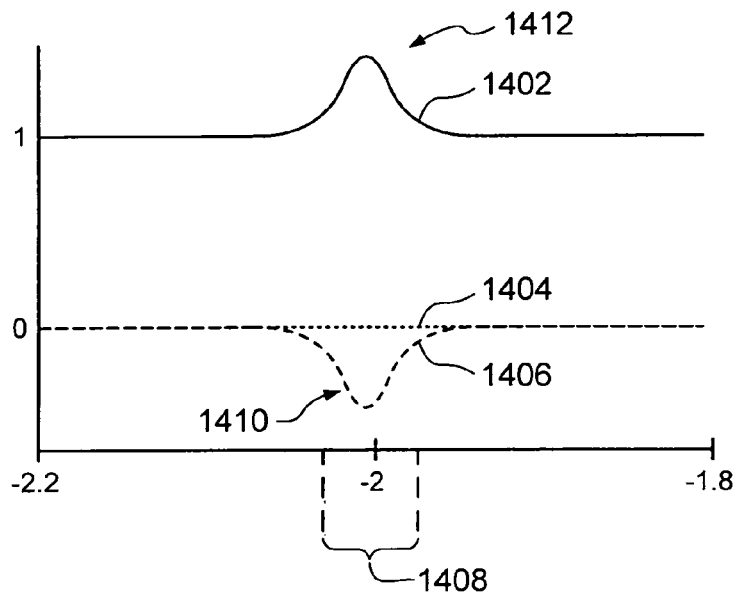
FIGS. 14A-14C illustrate simulation results for an example photonic grating.
Figure 14B:
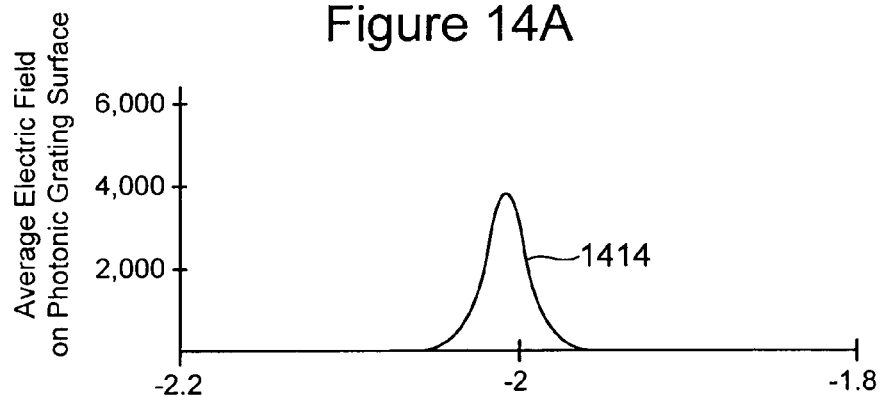
Figure 14C:
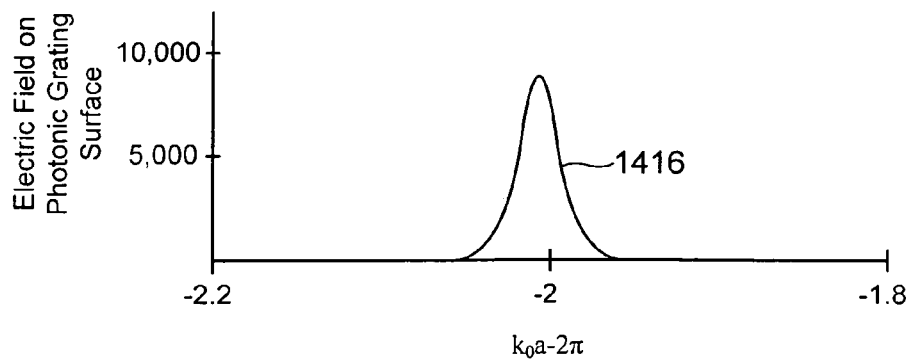

FIGS. 14A-14C illustrate simulation results for an example photonic grating. The photonic grating has a dielectric constant of 1.2−0.001i, thickness t of 10 nm, a square hole width w of 0.5 nm, and a square lattice constant a of 1000 nm. The negative imaginary part of the dielectric constant accounts for gain in the photonic grating. Electromagnetic waves over a range of frequencies are incident upon the photonic grating with incident angles $\theta$ and $\phi$ equal to zero and the same polarization. Horizontal axes, in FIGS. 14A-14C, correspond to vibrational frequencies in units of $k_0 a - 2\pi$. FIG. 14A shows transmission, reflection, and absorption intensity curves for the incident electromagnetic waves versus frequencies. Curve 1402 represents the transmission $|g(f)|$, dotted line 1404 represents reflection, and dashed curve 1406 represents absorption or gain of the photonic grating. The reflection line 1404 equals zero over the frequency range, which indicates that, in general, none of the incident coherent electromagnetic radiation is reflected by the photonic grating. Regions of the transmission curve 1402 equal to "1," and regions of the absorption curve 1406 equal to "0," indicate that the photonic grating is transparent to electromagnetic radiation with frequencies outside the range of frequencies identified by the frequency range 1408. However, attenuation portion 1410 of the absorption curve 1406 represents reduction in the intensity of electromagnetic radiation transmitted through the photonic grating due to the electromagnetic radiation coupling with resonance modes supported by the photonic grating. As the gain increases within the photonic grating, the circulating electromagnetic radiation builds up and is released from the photonic grating by emitting electromagnetic radiation over the same frequency range 1408, but with an amplified transmission intensity represented by the nonzero amplification portion 1412 of the transmission curve 1402. Note that electromagnetic radiation near the resonance (about −2) achieves the largest gain in transmission intensity. FIG. 14B shows the average electric field distribution at the surface of the photonic grating versus frequency. FIG. 14C shows the electric field strength distribution at the surface of the photonic grating versus frequency. Curves 1414 and 1416 indicate that the frequencies of the electric field components have corresponding frequencies in the range 1408.

Figure 15:
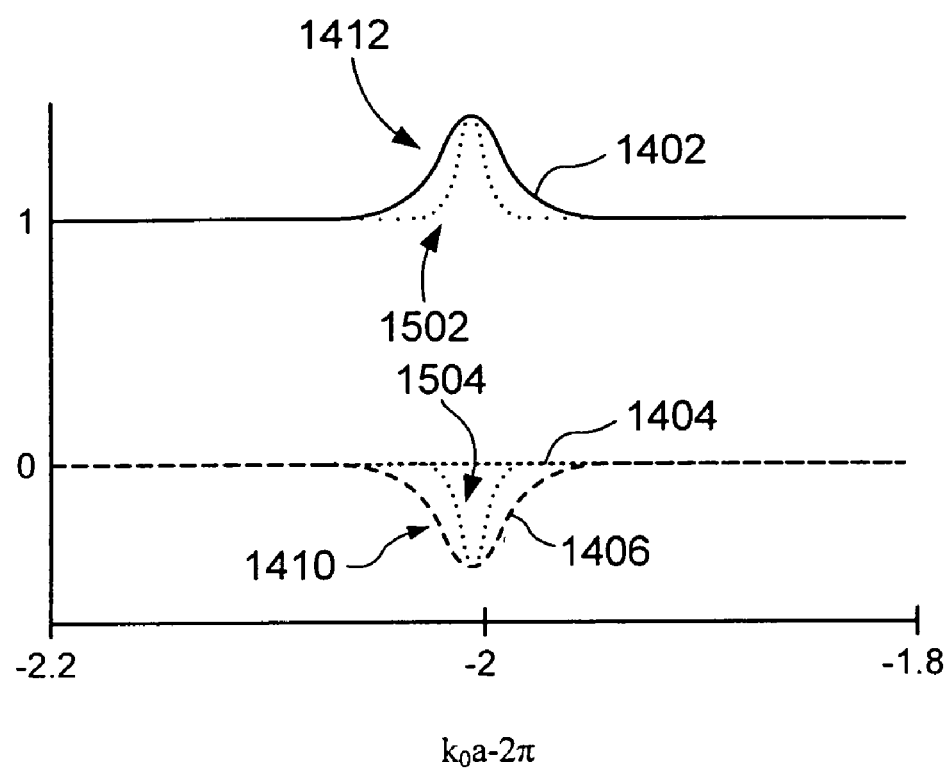
FIG. 15 shows a narrowed amplification and attenuation associated with a decrease in the thickness of a photonic grating.

The Q factor associated with the photonic grating may be increased by decreasing the thickness t, the hole width w, or the dielectric constant difference ($\epsilon_s - \epsilon_h$). As described above with reference to FIG. 8, decreasing the thickness t of the photonic grating is one way to narrow the amplification portion 1412 and the attenuation portion 1410, shown in FIG. 14A. FIG. 15 shows a narrower amplification portion 1502 and a narrower attenuation portion 1504 associated with a decreased thickness t of the photonic grating. Similar results may also be expected for decreased hole width w and ($\epsilon_s - \epsilon_h$).

Figure 16A:
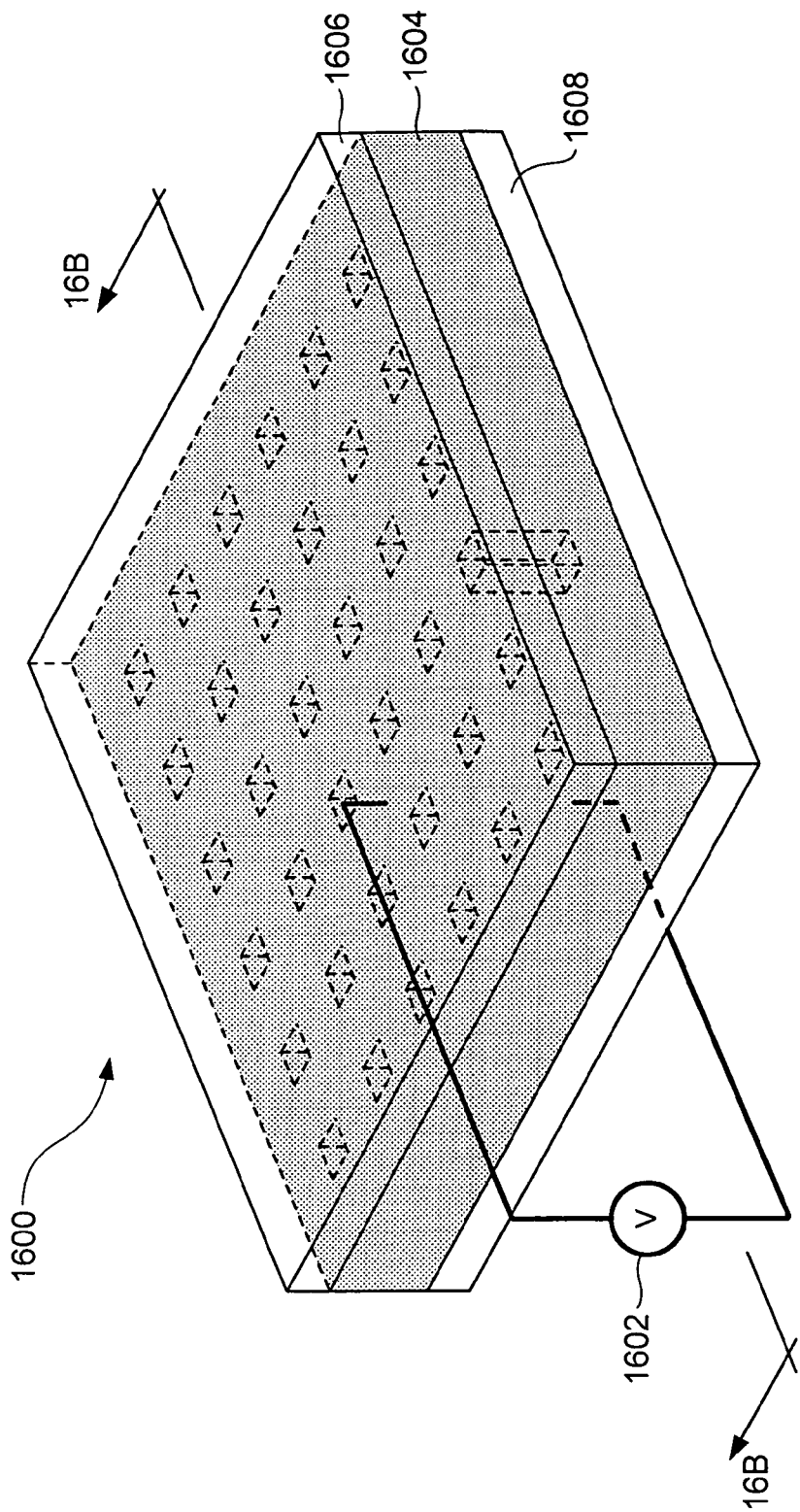
FIG. 16A illustrates a second electromagnetic radiation amplifier that represents an embodiment of the present invention.

In another embodiment of the present invention, the electronic stimulus provided by the pump source can be a voltage applied to the photonic grating. FIG. 16A illustrates an electromagnetic radiation amplifier 1600 that represents an embodiment of the present invention. The amplifier 1600 comprises a voltage source 1602 and a photonic grating 1604 sandwiched between two electrical contacts 1606 and 1608. As shown in FIG. 16, the voltage source 1602 is in electrical communication with the electrical contacts 1606 and 1608. The electrical contacts 1606 and 1608 can be composed of a transparent conducting dielectric material, such as Indium Tin Oxide, or the electrical contacts 1606 and 1608 can be composed of a conductive metal including holes so that incident electromagnetic radiation can be transmitted into the photonic grating 1604 and amplified electromagnetic radiation can be emitted from the photonic grating 1604. Additionally, an antireflection coating layer could be added to minimize spurious reflections from the electrodes.

Figure 16B:
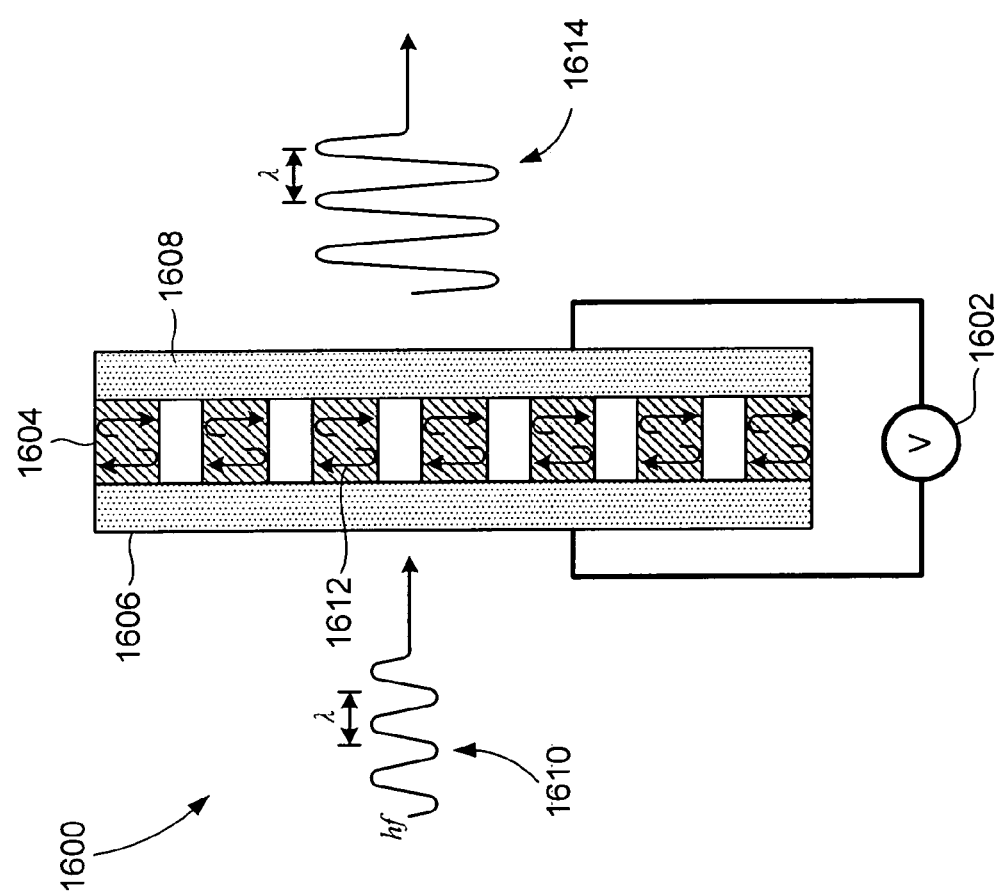
FIG. 16B illustrates a cross-sectional view of the amplifier shown in FIG. 16A that represents an embodiment of the present invention, taken along the line 16B-16B.

FIG. 16B illustrates a cross-sectional view of the amplifier 1600 shown in FIG. 16 that represents an embodiment of the present invention. A first coherent beam of electromagnetic radiation 1610 to be amplified is incident upon the photonic grating with a selected polarization and wave vector. The lattice constant a, dielectric constant $\epsilon$ of the slab material, hole width w, and thickness t of the photonic grating 1604 are pre-selected so that the incident coherent electromagnetic radiation 1610 couples with resonance modes supported by the photonic grating 1604, as described above with reference to FIGS. 6-8. The slab of the photonic grating 1604 may also be doped with a three-level or a four level dopant that emits electromagnetic radiation at substantially the same frequency of the incident coherent electromagnetic radiation 1610. The voltage source 1602 applies a voltage across the photonic grating that electronically stimulates the dopants of the photonic grating 1604 so that stimulated emission initiated by the coherent electromagnetic radiation 1610 resonating within the photonic grating 1604 of the dopants can occur. Directional arrows, such as directional arrow 1612, represent the circulation of coherent electromagnetic radiation building up within the photonic grating 1604. The coherent electromagnetic radiation building within the photonic grating has substantially the same phase, polarization, and frequency as the incident electromagnetic radiation. After coherent electromagnetic radiation builds with the photonic grating, a second coherent beam of electromagnetic radiation 1614 is emitted from the opposing surface of the photonic grating 1604. The emitted coherent beam of electromagnetic radiation 1614 has a larger amplitude and substantially the same phase, polarization, frequency, and direction as the incident coherent beam of electromagnetic radiation 1610.

Figures 17, 18:
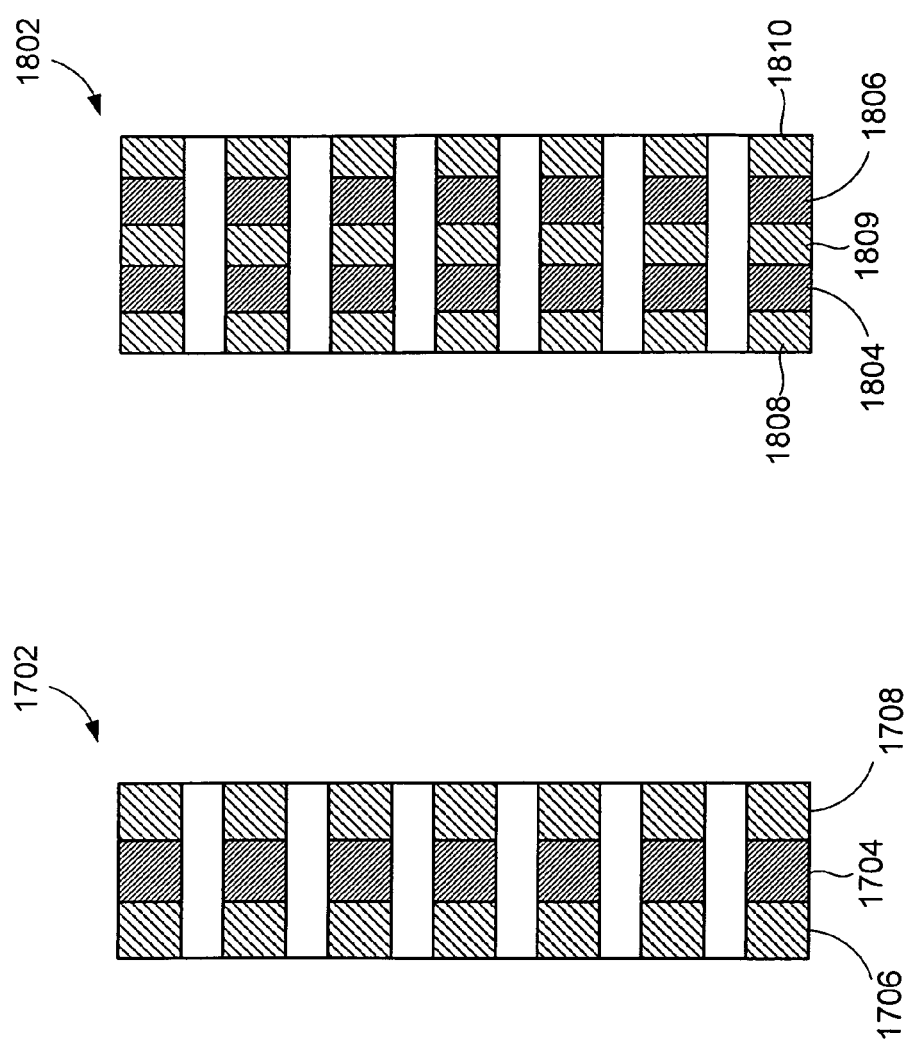
FIG. 17 illustrate a cross-sectional view of a first photonic grating comprising a single quantum well that represents an embodiment of the present invention.
FIG. 18 illustrates a cross-sectional view of a second photonic grating comprising two quantum wells that represents an embodiment of the present invention.

Although the present invention has been described in terms of particular embodiments, it is not intended that the invention be limited to these embodiments. Modifications within the spirit of the invention will be apparent to those skilled in the art. In other embodiments of the present invention, rather than using doped dielectric or semiconductor slabs, the photonic grating can be formed from one or more quantum wells, or even one or several layers of quantum dots. The quantum wells confine free electrons and holes to occupy a planar region and can be formed between semiconductor layers, whereas quantum dots confine carriers in small semiconductor clusters. For example, FIG. 17 illustrate a cross-sectional view of a first photonic grating 1702 comprising a single quantum well that represents an embodiment of the present invention. The photonic grating 1702 comprises a first semiconductor layer 1704 sandwiched between a second semiconductor layer 1706 and a third semiconductor layer 1708. The single quantum well is produced by selecting the first semiconductor layer 1704 with an electronic band gap that is smaller than the electronic band gap of the second and third semiconductor layers 1706 and 1708. FIG. 18 illustrates a cross-sectional view of a second photonic grating comprising two quantum wells that represents an embodiment of the present invention. The photonic grating 1802 comprises a first semiconductor layer 1804 and a second semiconductor layer 1806 separated by three semiconductor layers 1808-1810. The two quantum wells are created by selecting the first and second semiconductor layers 1804 and 1806 with an electronic band gap that is smaller than the electronic band gap of the three semiconductor layers 1808-1810.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The claims:

1. An electromagnetic radiation amplification system comprising:
    a photonic grating configured with a planar periodic lattice of holes in a slab, the slab having a first surface and a second surface located opposite the first surface, the holes extending from the first surface to the second surface;
    electromagnetic radiation emitters embedded within the slab; and
    a pump source configured to output an electronic stimulus to the photonic grating that excites electronic energy states in the electromagnetic radiation emitters, wherein the holes are configured so that a coherent beam of electromagnetic radiation incident on the first surface has resonance within the photonic grating and stimulates emission of electromagnetic radiation from the excited emitters to produce a beam of electromagnetic radiation output from the second surface and having substantially the same wavelength as, and larger amplitude than, the incident beam of electromagnetic radiation.

2. The system of claim 1 wherein the coherent beam of electromagnetic radiation incident upon the photonic grating couples with the guide electromagnetic radiation modes that can be supported by the photonic grating.

3. The system of claim 1 wherein the coherent beam of electromagnetic radiation incident upon the first surface of the photonic grating further comprises an incident direction that is out of the plane of the planar periodic lattice of holes.

4. The system of claim 1 wherein the electromagnetic radiation emitters of the photonic gating further comprises one or more dopants embedded in the slab.

5. The system of claim 1 wherein the electromagnetic radiation emitters of the photonic grating further comprises one or more quantum wells formed from alternating semiconductor layers having different dielectric constants.

6. The system of claim 1 wherein the electromagnetic radiation emitters of the photonic grating further comprises quantum dots.

7. The system of claim 1 wherein the slab further comprises one of:
   dielectric;
   silicon dioxide;
   silicon nitride; and
   organic material.

8. The system of claim 1 wherein the planar periodic lattice of holes further comprises one of:
   a square unit cell; and
   a triangular unit cell.

9. The system of claim 1 wherein the photonic grating further comprises a first conductor attached to a surface of the photonie grating and a second conductor attached to an opposing surface of the photonic grating such that first conductor and the second conductor are in electrical communication with a voltage source.

10. The system of claim 9 wherein the first conductor and the second conductor further comprises one of:
   substantially transparent dielectric conductors; and
   metallic electrodes patterned with holes to allow a second coherent signal to be emitted from the photonic grating.

11. The system of claim 1 wherein the pump source further comprises a light source configured to output a beam of electromagnetic radiation with a frequency that excites the photonic grating into an excited electronic energy state.

12. The system of claim 1 wherein the amplified coherent beam of electromagnetic radiation has substantially the same wavelength, phase, and direction as the coherent beam of electromagnetic radiation incident upon the photonic grating.

13. A method for amplifying electromagnetic radiation comprising:
   providing a photonic grating having a planar periodic lattice of holes in a slab and electromagnetic radiation emitters embedded within the slab, the slab having a first surface and a second surface located opposite the first surface, the holes extending from the first surface to the second surface;
   pumping the photonic grating to place the electromagnetic radiation emitters of the slab in a higher energy electronic state;
   inputting a coherent beam of electromagnetic radiation onto the photonic grating, the beam of electromagnetic radiation incident on the first surface in a direction out of the plane of the planar periodic lattice of holes and having resonance within the photonic grating, wherein the coherent beam of electromagnetic radiation couples stimulates the emission of electromagnetic radiation from the electromagnetic radiation emitters that amplifies the coherent beam of electromagnetic radiation;
   outputting the amplified beam of electromagnetic radiation from the second surface.

14. The method of claim 13 wherein pumping the photonic grating further comprises applying a voltage across the photonic grating such that the voltage places the slab in a higher energy electronic state.

15. The method of claim 13 wherein pumping the photonic grating further comprises applying an incident beam of electromagnetic radiation that places the slab in a higher energy electronic state.

16. The method of claim 13 wherein the photonic grating further comprises a first conductor attached to a surface of the photonic grating and a second conductor attached to an opposing surface of the photonic grating such that first conductor and the second conductor are in electrical communication with a voltage source.

17. The method of claim 16 wherein the first conductor and the second conductor are dielectric conductors.

18. The method of claim 16 wherein the first conductor is a metallic electrode and the second conductor is a metallic electrode patterned to allow transmission of the electromagnetic radiation.

19. The method of claim 13 wherein the amplified coherent beam of electromagnetic radiation has substantially the same wavelength, phase, and direction as the incident coherent beam of electromagnetic radiation.

20. The method of claim 13 wherein forming the photonic grating further comprises forming and spacing the holes so that the coherent beam of electromagnetic radiation has a resonance within the photonic grating.

* * * * *

UNITED STATES PATENT AND TRADEMARK OFFICE
CERTIFICATE OF CORRECTION

PATENT NO.        : 7,805,041 B2
APPLICATION NO.   : 11/726104
DATED             : September 28, 2010
INVENTOR(S)       : David Fattal et al.

It is certified that error appears in the above-identified patent and that said Letters Patent is hereby corrected as shown below:

In column 12, line 39, in Claim 9, delete "photonie" and insert -- photonic --, therefor.

Signed and Sealed this
Twenty-ninth Day of March, 2011

David J. Kappos
*Director of the United States Patent and Trademark Office*